United States Patent [19]

Nelson

[11] 4,434,397
[45] Feb. 28, 1984

[54] REMOTE LOAD CURRENT SENSOR

[75] Inventor: Conrad E. Nelson, Camillus, N.Y.

[73] Assignee: General Electric Company, Syracuse, N.Y.

[21] Appl. No.: 334,084

[22] Filed: Dec. 24, 1981

[51] Int. Cl.³ ............................................. C01R 27/04
[52] U.S. Cl. .................................. 324/58 R; 333/33; 343/703
[58] Field of Search ...................... 343/17.7, 703, 894; 333/17 M, 33; 324/57 R, 58 R, 58 B

[56] References Cited

U.S. PATENT DOCUMENTS

| | | | |
|---|---|---|---|
| 3,058,108 | 10/1962 | Turner et al. | 343/100 |
| 3,281,721 | 10/1966 | Clark | 333/17.7 |
| 3,772,700 | 11/1973 | Belli | 343/703 |
| 3,906,411 | 9/1975 | Lind et al. | 333/32 |
| 4,096,441 | 6/1978 | Schwartz | 325/133 |

*Primary Examiner*—Eli Lieberman
*Attorney, Agent, or Firm*—Carl W. Baker; Richard V. Lang

[57] ABSTRACT

Antenna arrays with more than one radiating element often require a calibration or adaptive technique to monitor the individual antenna currents and provide some form of correction. This invention is directed to a system of directional couplers and transmission lines usually placed between the transmitter and element matching network that develops a signal which is proportional to the actual antenna element radiating current. This includes mismatches and mutual impedance effects. A knowledge of the matching network is required. The system can be used in any guided transmission line system (i.e., waveguide, coax, stripline, microstrip, etc.)

7 Claims, 3 Drawing Figures

REMOTE LOAD CURRENT SENSOR

The Government has rights in this invention pursuant to Contract F30602-80-C-0018 awarded by the Department of the Air Force.

BACKGROUND OF THE INVENTION

This invention relates to RF current and voltage measurement, and more particularly to means for accomplishing such measurements for loads which are remotely located or otherwise not directly accessible to measurement instrumentation.

In radar and other RF radiation systems it often is necessary to monitor the radiated power by measurement of the current or voltage at the antenna, particularly in the case of phased array antenna systems. In such systems the power level and phase at each of the individual antenna elements comprising the array affects the direction and shape of the beam or beams formed thereby, so for purposes of system alignment and performance monitoring there is need for a capability to measure power and phase at each element. This presents problems, however, both because of the difficulty of access to individual antenna elements to accomplish the desired measurement, and because the measurement apparatus itself may perturb the parameter to be measured. These problems derive principally from the fact that in array antennas the antenna elements typically are structurally or otherwise closely integrated with their matching networks and sometimes with the transmission lines of the distribution network through which they are fed, making measurements directly at the individual elements difficult if not impossible.

The prior art includes many approaches to measurement of antenna operating parameters, in a number of which the measurements are made remotely from the load element. In some known phased array systems, for example, an approximation of the radiated vector amplitude at each antenna element is derived by interposing a directional coupler in the feed line to the element matching network, and measuring the forward voltage ($\overline{V}_F$) as coupled into one arm of the hybrid and the reflected voltage ($\overline{V}_F$) as coupled into another arm. After introduction of an empirically determined factor ($\overline{C}_F$) to compensate for line transfer, the radiated vector amplitude ($\overline{V}_A$) is assumed to be equal to $\overline{V}_F\overline{C}_F$, and the VSWR equal to:

$$\frac{|\overline{V}_F\overline{C}_F| - |\overline{V}_R/\overline{C}_F|}{|\overline{V}_F\overline{C}_F| + |\overline{V}_R/\overline{C}_F|}$$

From the values of $\overline{V}_A$ and VSWR thus obtained a value of antenna element current amplitude may be calculated. Obviously, however, the accuracy of the result is critically dependent on the validity of the foregoing assumed equality, and this assumption typically is only approximately correct because of mismatch and mutual coupling effects which perturb the relationships assumed.

The present invention has as a primary purpose the provision of apparatus for RF current and voltage measurements which is not dependent on assumed relationships between input and load parameters, and which provides accurate measurement of load current and voltage without requiring direct access to the load for the purpose of such measurements. The apparatus of the invention is adaptable to use with any guided transmission line system, such as waveguide, coaxial cable, stripline and microstrip, and for its operation requires only a knowledge of the characteristics of the matching network at the system operating frequency.

BRIEF SUMMARY OF THE INVENTION

In accordance with one presently preferred embodiment of the invention, the current amplitude in a remotely located antenna element which is coupled to its feed line through a matching network, is sensed by measurement apparatus connecting into the feed line and comprising two directional couplers, two dissimilar lengths of transmission line, a dummy load and an RF voltmeter. One of the couplers has two of its arms connected into the feed line, and each of its other two arms connected to an end of one of the two lengths of transmission line. The other ends of these lines each connect into one of the arms of the second coupler, and its remaining arms connect one to the dummy load and the other to the voltmeter. With the relative lengths of the two transmission line elements adjusted so as to bring the signals transmitted to the second directional coupler into the proper phase relationship, the voltage output from this coupler to the RF voltmeter is directly proportional to antenna element current and thus provides an accurate measure thereof. It is also possible in accordance with this invention to measure load voltage with similar accuracy and with the same simplicity of apparatus.

BRIEF DESCRIPTION OF THE DRAWINGS

These and other objects, features and advantages of the invention will be further understood by reference to the following detailed description when read in conjunction with the accompanying drawings, wherein.

DETAILED DESCRIPTION OF PREFERRED EMBODIMENT

Figure 1:
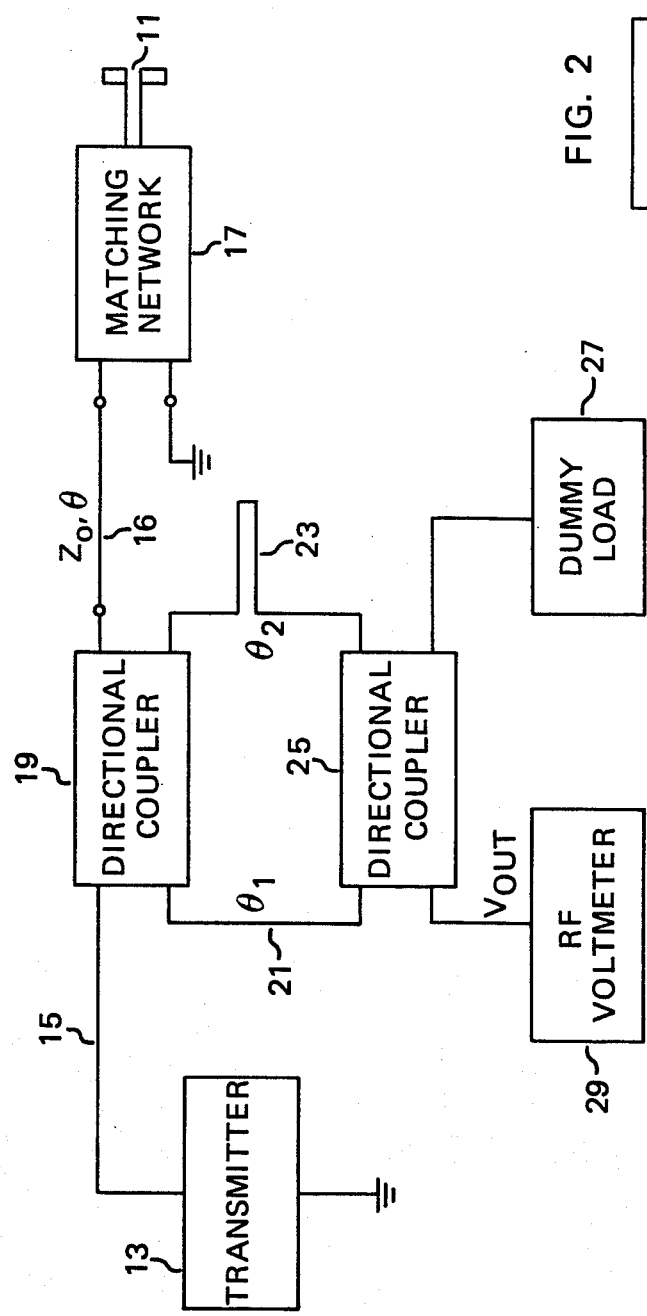
FIG. 1 is a block diagram of remote load current measurement apparatus in accordance with the invention.

With continued reference to the drawings, wherein like reference numerals have been used throughout to designate like elements, FIG. 1 illustrates the present invention as applied to the measurement of current in an antenna element, as for example one of the radiating elements of a phased array antenna. The antenna element 11 is driven by a transmitter shown at 13, and is coupled thereto through feed lines 15 and 16 both having a characteristic impedance $Z_o$. An antenna element matching network 17 is disposed immediately adjacent the antenna element, and commonly is structurally and electrically integrated therewith in a manner such as effectively to preclude the connection of measurement apparatus between the matching network and antenna element.

In accordance with the invention, the desired measurement may be accomplished by connecting a first directional coupler 19 at a point in the feed line 15-16 preferably closely adjacent to the matching network 17. If the coupler is spaced from the matching network by any significant length of feed line 16, the electrical length $\theta$ of such intervening line must be factored into the measurement as hereinafter explained.

Directional coupler 19 may be a two-hole waveguide coupler or other conventional coupler of suitable type, and may have a relatively low coupling factor since only enough power need be tapped off the feed line for measurement purposes. Each of the coupled arms of coupler 19 is connected to an end of one of two dissimilar lengths of transmission line 21 and 23 which, due to their length differential, respectively effect phase shifts $\theta_1$ and $\theta_2$ of different magnitude in the signals propagating through them. These signals in lines 21 and 23 constitute sampled values of the reflected voltage $V_r$ and incident voltage $V_i$, respectively, at the input side of matching network 17.

The remote ends of transmission lines 21 and 23 connect into two of the arms of a second directional coupler 25 which may take the form of a conventional hybrid waveguide junction having coupling characteristics as discussed in greater detail hereinafter. The output arms of this coupler are connected one to a dummy load 27 and the other to an RF voltmeter 29. This voltmeter may be of conventional type capable of measuring the complex value of an applied voltage or, if phase information is not needed on the particular system under test, the voltmeter need measure only voltage amplitude. As will be shown, the output indication of voltmeter 29 may, by proper adjustment of the circuit elements, be made directly and accurately proportional to antenna element current amplitude, so that $$IA = MV_{out} \tag{1}$$

where M is constant determined as hereinafter explained.

Figure 2:
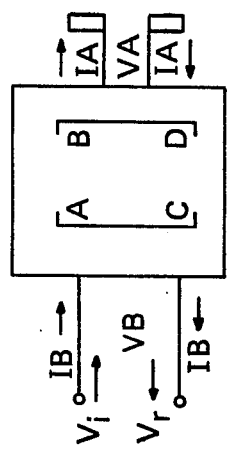
FIG. 2 illustrates the antenna element and matching network of FIG. 1 in greater detail.

Reference will now be made to FIG. 2, which illustrates the notation used in the following discussion of antenna element and matching network operation. FIG. 2 shows an antenna element (with current IA and voltage VA) and a general matching network described by an ABCD or chain matrix. The total input current and voltage are IB and VB respectively. The standard input and output current and voltage relationships in terms of the ABCD parameters are:

$$VB = A \cdot VA + B \cdot IA \tag{2a}$$

$$IB = C \cdot VA + D \cdot IA \tag{2b}$$

The voltage VA can be eliminated from these equations and the resulting antenna current is:

$$IA = (A \cdot IB - C \cdot VB)/(A \cdot D - B \cdot C) \tag{3}$$

The total input voltage (VB) and current (IB) to the matching element can be determined in terms of the incident and reflected voltages. Thus $$VB = V_i + V_r \tag{4a}$$

$$IB = I_i - I_r \tag{4b}$$

where $$I_i = V_i/Z_o \tag{5a}$$

$$I_r = V_r/Z_o \tag{5b}$$

and $$IB = (V_i - V_r)/Z_o \tag{6}$$

The resulting formula for the antenna current is:

$$KA = I\,[V_i - (H\angle\phi)V_r] \tag{7a}$$

where $$K = (A - C \cdot Z_o)/[Z_o(A \cdot D - B \cdot C)] \tag{7b}$$

$$H\angle\phi = (A + C \cdot Z_o)/(A - C \cdot Z_o) \tag{7c}$$

Note that for a reciprocal network $$A \cdot D - B \cdot C = 1 \tag{8}$$

and for a reciprocal and lossless matching network "A" is real and "C" is imaginary, i.e., $$A = A' + j0 \tag{9a}$$

$$C = 0 + jC'' \tag{9b}$$

Therefore, for a reciprocal and lossless antenna element matching network:

$$H\angle\phi = (A' + jC''Z_o)/(A' - jC''Z_o) \tag{10a}$$

or $$H = 1 \tag{10b}$$

$$\phi = 2\tan^{-1}(C''Z_o/A') \tag{10c}$$

and $$IA = K[V_i - V_r\angle\phi] \tag{11}$$

If $V_i$ and $V_r$ are added together with the proper phase angle, as determined by the relative lengths of the two lines 21, 23 and their respective phase shifts $\theta_1$, $\theta_2$, the resultant signal is proportional to the antenna current IA. Note for the above case that the value of K is:

$$K = A'Z_o - jC'' \tag{12}$$

An example of a simple antenna element matching network is a single transmission line, of characteristic impedance $Z_m$ and electrical length $\theta_m$. In a typical system such a matching network might have a characteristic impedance $Z_m = 70$ ohms and phase angle $\theta_m = 120$ degrees, and be coupled to a source for which the characteristic impedance $Z_o = 50$ ohms.

Then $$A = \cos(\theta_m) \tag{13a}$$

$$C = j(1/Z_m)\sin(\theta_m) \tag{13b}$$

$$H = 1 \tag{14a}$$

$$\phi = 2\tan^{-1}[(Z_o/Z_m)\tan(\theta_m)] \tag{14b}$$

$$= 258 \text{ degrees}$$

It will be noted that $2\theta_m$ is 240 degrees in this example, but due to the mismatch $\phi = 258$ degrees.

The value of the constant K for this network can be calculated from Equation (12), and represents the contribution to the proportionality factor M of Equation (1) which is attributable to the matching network. The other principal contributors to the value of M are the characteristics of the two directional couplers 19, 25 and of the two lengths of transmission line 21, 23 connecting the couplers. These characteristics and their interrelationships with K and M will be developed in the following discussion of the embodiment of FIG. 3.

Figure 3:
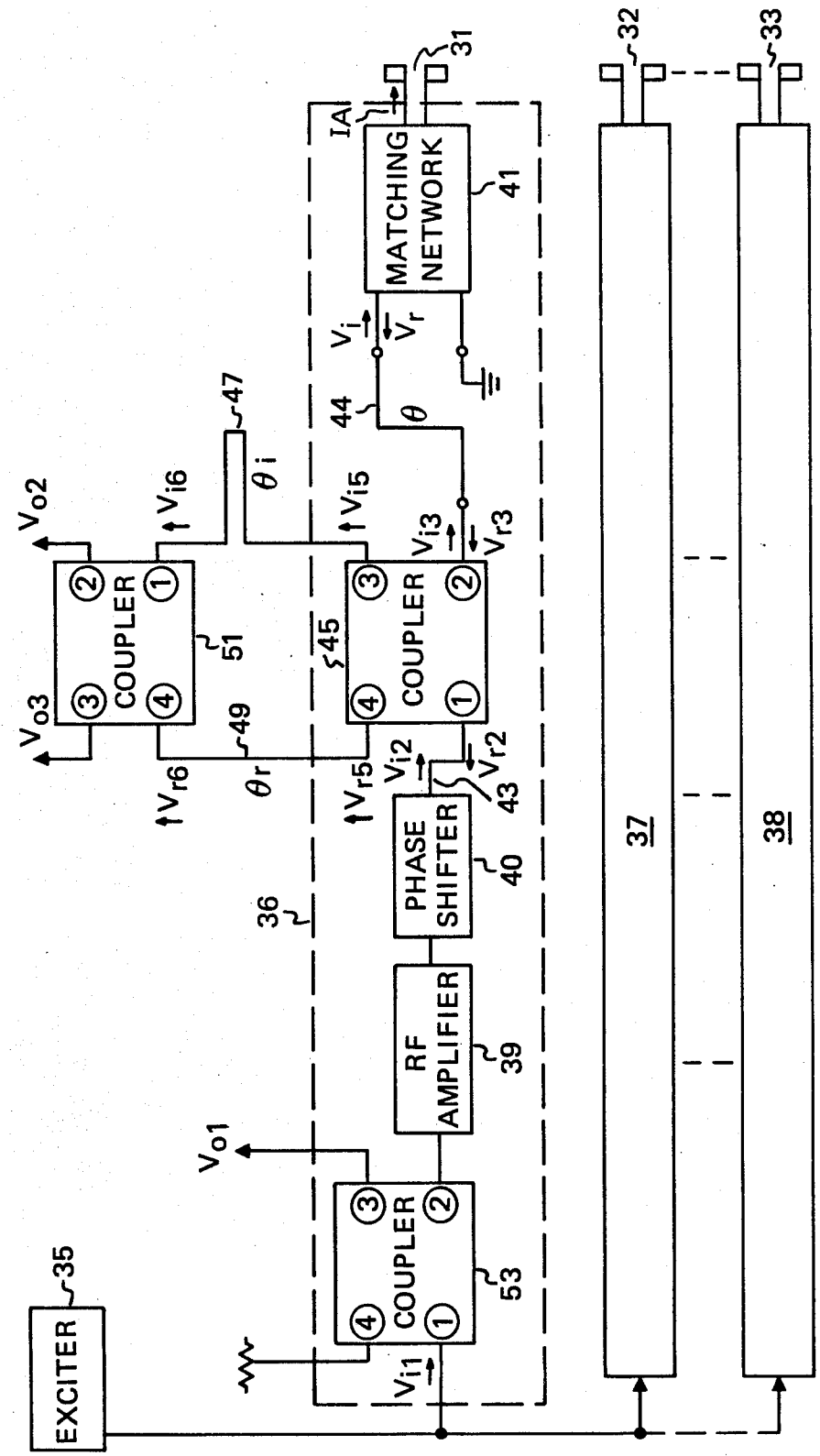
FIG. 3 is a block diagram of a current and voltage monitoring system particularly adapted to use with a phased array antenna.

In FIG. 3, measurement apparatus in accordance with the invention is shown applied to a phased array system comprising a plurality of antenna elements three of which are illustrated at 31, 32 and 33. The several antenna elements are coupled to a common exciter 35 through individual transmitter chains 36, 37 and 38 each including an RF power amplifier 39 and phase shifter 40. Each antenna element is connected to its respective amplifier through a matching network 41 and feed lines 43 and 44 as in the embodiment previously described.

A first directional coupler 45 interposed between feed lines 43 and 44 couples incident voltage ($V_{i2}$) and reflected voltage ($V_{r3}$) signals into dissimilar length transmission lines 47 and 49, respectively, and through them to a second directional coupler 51 which is similar to the coupler 25 of FIG. 1 except that in the interests of generality neither of the coupler outputs here is shown terminated by a dummy load. A third directional coupler 53 is shown connected between the exciter 35 and power amplifier 39, to provide a measure of the voltage ($V_{o1}$) input to the power amplifier and thus of the antenna drive level.

Designating the power coupling factors for directional couplers 45, 51 and 53 as "p," "q" and "s" respectively, the scattering matrix or table of S-parameters for these couplers at a single center frequency is as follows:

| S-PARAMETERS | DIRECTIONAL COUPLER | | |
| --- | --- | --- | --- |
| | 45 | 51 | 53 |
| $S_{11}=S_{22}=S_{33}=S_{44}=$ | 0 | 0 | 0 |
| $S_{21}=S_{12}=S_{43}=S_{34}=$ | $j\sqrt{1-p}$ | $j\sqrt{1-q}$ | $j\sqrt{1-s}$ |
| $S_{31}=S_{13}=S_{42}=S_{24}=$ | $-\sqrt{p}$ | $-\sqrt{q}$ | $-\sqrt{s}$ |
| $S_{41}=S_{14}=S_{32}=S_{23}=$ | 0 | 0 | 0 |

Note that in this example forward wave directional couplers are utilized, i.e., with an input at port 1 the main output is at port 2, the coupled port is port 3 and the isolated port is port 4. A backward wave directional coupler could be used if preferred.

The various incident and reflected voltages are indicated in FIG. 3, in which the parameter $\theta$ represents the phase shift attributable to the length of transmission line 44 between the coupler 45 and matching network 41, and the other parameters are as previously described. The electrical length $\theta$ is arbitrary but must be known.

The output voltages $V_{o2}$ and $V_{o3}$ may be derived from the following relations:

$$V_{o1} = -\sqrt{s}\, V_{i1} \tag{15a}$$

$$V_i = V_{i3} \angle -\theta \tag{15b}$$

$$V_{r3} = V_r \angle -\theta \tag{15c}$$

$$V_{i3} = j\sqrt{1-p}\, V_{i2} \tag{15d}$$

$$V_{r2} = j\sqrt{1-p}\, V_{r3} \tag{15e}$$

$$V_{i5} = -\sqrt{p}\, V_{i2} \tag{15f}$$

$$V_{r5} = -\sqrt{p}\, V_{r3} \tag{15g}$$

$$V_{i6} = V_{i5} \angle -\theta_i \tag{15h}$$

$$V_{r6} = V_{r5} \angle -\theta_r \tag{15i}$$

$$V_{o2} = j\sqrt{1-q}\, V_{i6} - \sqrt{q}\, V_{r6} \tag{15j}$$

$$V_{o3} = -\sqrt{q}\, V_{i6} + j\sqrt{1-q}\, V_{r6} \tag{15k}$$

These equations are used to determine $V_{o2}$ and $V_{o3}$ in terms of $V_i$ and $V_r$. Two cases are considered. The first case is where $V_{o2}$ is desired; $V_{o3}$ is not used and port 3 of coupler 51 is terminated in a dummy load (not shown). The second case is where $V_{o3}$ is desired and $V_{o2}$ is not used (dummy load). The results of the analysis show that:

CASE I

If $$\theta_i = \theta_r + 2\theta + \phi \tag{16a}$$

and $$q = \frac{1}{2-p} = \frac{1}{2} + \frac{p}{2(2-p)} \tag{16b}$$

then $$IA = MV_{o2} \tag{16c}$$

where $$M = K\sqrt{(2-p)/p} \angle \theta_r + \theta + \phi + \pi \tag{16d}$$

CASE II

If $$\theta_i = \theta_r + 2\theta + \phi \pm \pi \tag{17a}$$

and $$q = \frac{(1-p)}{(2-p)} = \frac{1}{2} - \frac{p}{2(2-p)} \tag{17b}$$

then $$IA = MV_{o3} \tag{17c}$$

where $$M = K\sqrt{(2-p)/p} \quad \angle \theta_r + \theta + \phi \pm \pi + \pi/2 \quad (17d)$$

For lossless (or very low loss) feed lines and matching networks, the $\theta_i$ path length (line 47) is longer than $\theta_r$ (line 49) by $2\theta + \phi$ for Case I and by $2\theta + \phi \pm \pi$ for Case II. This extra path length brings the sampled incident and reflected voltages $V_i$ and $V_r$ into the proper phase condition before they are added together in directional coupler 51. When directional coupler 45 has very loose coupling ($p << 1$) then directional coupler 51 is essentially a 3 dB coupler or hybrid. If $V_{o2}$ is used then $q = \geq 0.5$ and if $V_{o3}$ is used then $q = \leq 0.5$. If the matching network 41 is very complex such that its equivalent phase angle $\phi$ varies with frequency in a manner other than a length of transmission line, then the $\theta_i$ line 47 may be constructed to match this variation by a corresponding variation in $\theta_i$ as a function of frequency. If the matching network and/or transmission lines are lossy then directional coupler 51 is adjusted to compensate for these losses.

The additional capability to measure the input voltage $V_{o1}$ in the embodiment of FIG. 3 may serve several purposes. By monitoring both the voltage $V_{o1}$ and the antenna current amplitude IA the source of any variation in antenna current may be determined to be attributable to a change in gain of amplifier 39 or a shift in the phase angle introduced by phase shifter 40, or to a change in mutual coupling between the antenna element 31 and its neighboring elements. The $V_{o1}$ measurement is thus of value in performance monitoring and fault localization.

As previously noted, the measurement apparatus of this invention is not limited to measuring antenna currents. Any current could be measured. Also VA could be measured instead of IA. A similar analysis indicates that:

$$VA = (D \cdot VB - B \cdot IB)/(A \cdot D - B \cdot C) \quad (18a)$$

or $$VA = k[V_i + (h \angle \gamma) V_r] \quad (18b)$$

where $$k = (D - B/Z_0)/(A \cdot D - B \cdot C) \quad (18c)$$

$$h \angle \gamma = (D \cdot Z_o + B)/(D \cdot Z_o - B) \quad (18d)$$

Again for a lossless reciprocal network $$D = D' + j0 \quad (19a)$$

$$B = 0 + jB'' \quad (19b)$$

and $$h = 1 \quad (19c)$$

$$\gamma = 2 \tan^{-1}(B''/(D' \cdot Z_o)) \quad (19d)$$

Thus the apparatus of the invention may be used for remote measurement of voltage as well as current. Other applications and modifications will be obvious to those skilled in the art and accordingly will fall within the scope of the invention as defined in the following claims.

What is claimed is:

1. Measurement apparatus for determining the amplitude and phase of an RF load parameter in a remote load element coupled to its power source through a transmission line of characteristic impedance $Z_o$ and a load matching network of known characteristics, comprising:
   (a) a first directional coupler interposed in said transmission line between the power source and load matching network, said coupler providing first and second output signals respectively proportional to the incident and reflected voltages $V_i$ and $V_r$ at the input to said matching network;
   (b) first and second transmission line elements connected to receive said coupler output signals, said transmission line elements being of different phase lengths so as to introduce a relative phase shift of predetermined magnitude as between the first and second output signals;
   (c) a second directional coupler having as inputs thereto said first and second output signals as respectively coupled through said first and second transmission line elements and providing a voltage output $V_o$ proportional to the $V_i$ and $V_r$ signals combined in the phase relationship predetermined by said transmission line elements; and
   (d) means for measuring the amplitude and phase of a voltage output of said second directional coupler thereby to obtain a measure of the desired parameter in said remote load element.

2. Measurement apparatus as defined in claim 1 wherein the parameter to be measured is load current $I_1$ and is equal to the product of the voltage output $V_o$ of said second directional coupler times a constant, M, where $$M = K\sqrt{(2-p)/p} \quad \angle \theta_r + \theta + \phi + \pi$$

and $$\theta_i = \theta_r + 2\theta + \phi$$

and $$q = 1/2 - p$$

in which K is a constant, p and q are the power coupling factors for said first and second directional couplers, respectively, $\theta$ is the electrical length of said feed line between said first directional coupler and said matching network, $\theta_i$ and $\theta_r$ are the electrical lengths of said transmission line elements, and $\phi$ is a phase angle determined by the matching network characteristics in accordance with the relation $$\phi = 2 \tan^{-1}(C'' Z_o/A')$$

in which $C''$ and $A'$ are matching network matrix parameters.

3. Measurement apparatus as defined in claim 1 wherein the parameter to be measured is load current $I_1$ and is equal to the product of the voltage output $V_o$ of said second directional coupler times a constant, M, where $$M = K\sqrt{(2-p)/p} \; \angle \theta_r + \theta + \phi \pm \pi + \pi/2$$

and $$\theta_i = \theta_r + 2\theta + \phi \pm \pi$$

and $$q = 1 - p/2 - p$$

in which K is a constant, p and q are the power coupling factors for said first and second directional couplers, respectively, $\theta$ is the electrical length of said feed line between said first directional coupler and said matching network, $\theta_i$ and $\theta_r$ are the electrical lengths of said transmission line elements, and $\phi$ is a phase angle determined by the matching network characteristics in accordance with the relation $$\phi = 2 \tan^{-1}(C'Z_o/A')$$

in which C" and A' are matching network matrix parameters.

4. Measurement apparatus as defined in claim 2 or claim 3 wherein the constant, K, is given by the relation $$K = (A - C \cdot Z_o)/[Z_o(A \cdot D - B \cdot C)]$$

in which A,B,C and D are the matching network matrix parameters.

5. Measurement apparatus as defined in claim 1 wherein the parameter to be measured is load voltage $V_1$ and is equal to the product of the voltage output $V_o$ of said second directional coupler times a constant, M, where $$M = k\sqrt{(2-p)/p} \; \angle \theta_r + \theta + \gamma$$

and $$\theta_i = \theta_r + 2\theta + \gamma \pm \pi$$

and $$q = 1/2 - p$$

in which k is a constant, p and q are the power coupling factors for said first and second directional couplers, respectively, $\theta$ is the electrical length of said feed line between said first directional coupler and said matching network, $\theta_i$ and $\theta_r$ are the electrical lengths of said transmission line elements, and $\gamma$ is a phase angle determined by the matching network characteristics in accordance with the relation $$\gamma = 2 \tan^1 [B''/(D' \cdot Z_o)]$$

in which B" and D' are matching network matrix parameters.

6. Measurement apparatus as defined in claim 1 wherein the parameter to be measured is load voltage $V_1$ and is equal to the product of the voltage output $V_o$ of said second directional coupler times a constant, M, where $$M = k\sqrt{(2-p)/p} \; \angle \theta_r + \theta + \gamma + \pi/2$$

and $$\theta_i = \theta_r + 2\theta + \gamma$$

and $$q = 1 - p/2 - p$$

in which k is a constant, p and q are the power coupling factors for said first and second directional couplers, respectively, $\theta$ is the electrical length of said feed line between said first directional coupler and said matching network, $\theta_i$ and $\theta_r$ are the electrical lengths of said transmission line elements, and $\gamma$ is a phase angle determined by the matching network characteristics in accordance with the relation $$\gamma = 2 \tan^1 [B''/(D' \cdot Z_o)]$$

in which B" and D' are matching network matrix parameters.

7. Measurement apparatus as defined in claim 5 or claim 6 wherein the constant, k, is given by the relation $$k = (D - BZ_o)/(A \cdot D - B \cdot C)$$

in which A,B,C and D are the matching network matrix parameters.

* * * * *